US012571972B2

(12) United States Patent
Skiba-Szymanska et al.

(10) Patent No.: US 12,571,972 B2
(45) Date of Patent: Mar. 10, 2026

(54) ELECTRONIC PACKAGE AND METHOD OF MANUFACTURING AN ELECTRONIC PACKAGE

(71) Applicant: Kabushiki Kaisha Toshiba, Tokyo (JP)

(72) Inventors: Joanna Krystyna Skiba-Szymanska, Cambridge (GB); Jonathan Rupert Ayang Mueller, Cambridge (GB); Richard Mark Stevenson, Cambridge (GB); Andrew James Shields, Cambridge (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 342 days.

(21) Appl. No.: 18/161,945

(22) Filed: Jan. 31, 2023

(65) Prior Publication Data

US 2024/0053552 A1 Feb. 15, 2024

(30) Foreign Application Priority Data

Aug. 10, 2022 (GB) ..................................... 2211691

(51) Int. Cl.
G02B 6/42 (2006.01)
H01S 5/02315 (2021.01)
H01S 5/02345 (2021.01)

(52) U.S. Cl.
CPC .......... G02B 6/4257 (2013.01); G02B 6/426 (2013.01); G02B 6/4269 (2013.01);
(Continued)

(58) Field of Classification Search
CPC .... G02B 6/4257; G02B 6/426; G02B 6/4269; G02B 6/4271; G02B 6/428; H01S 5/02315; H01S 5/02345
See application file for complete search history.

(56) References Cited

U.S. PATENT DOCUMENTS 5,329,157 A * 7/1994 Rosotker ................. H01L 24/49
257/E23.128
8,093,697 B2 1/2012 Haba et al.
(Continued)

FOREIGN PATENT DOCUMENTS

EP 0 847 087 A2 6/1998
JP 4-130651 A 5/1992
(Continued)

OTHER PUBLICATIONS

Japanese Office Action issued Apr. 23, 2024 in Japanese Application 2023-023734 (with English Translation), 12 pages.
(Continued)

*Primary Examiner* — Thomas A Hollweg
*Assistant Examiner* — Marc E Manheim
(74) *Attorney, Agent, or Firm* — Oblon, McClelland, Maier & Neustadt, L.L.P.

(57) ABSTRACT

An electronic package comprising: an active element; a first substrate; and a second substrate, the first substrate comprising a plurality of conductive tracks on a first surface, the second substrate comprising a plurality of conductive tracks on a second surface, the active element being provided on the first surface of the first substrate, the second substrate being provided overlying the first surface of the first substrate such that a face of the second substrate which is opposite to the second surface is in contact with the first surface, the second substrate having an opening to allow access to the active element and being positioned on the first substrate such that at least some of the plurality of conductive tracks on the first surface are exposed, the active element being electrically connected to at least some of the plurality of tracks on the first substrate and the plurality of tracks on the second substrate.

14 Claims, 6 Drawing Sheets

(52) U.S. Cl.
CPC ........... *G02B 6/4271* (2013.01); *G02B 6/428* (2013.01); *H01S 5/02315* (2021.01); *H01S 5/02345* (2021.01)

(56) References Cited

U.S. PATENT DOCUMENTS

| | | | |
|---|---|---|---|
| 8,581,381 | B2 | 11/2013 | Zhao et al. |
| 8,703,511 | B2 * | 4/2014 | Matoba .............. H10H 20/8506 |
| | | | 438/26 |
| 12,249,805 | B2 * | 3/2025 | Yang ................... H01S 5/06825 |
| 2004/0201987 | A1 * | 10/2004 | Omata .............. H10H 20/8506 |
| | | | 362/800 |
| 2006/0113665 | A1 | 6/2006 | Lee et al. |
| 2009/0219963 | A1 | 9/2009 | Mogi |
| 2010/0304531 | A1 | 12/2010 | Sasaki et al. |
| 2017/0097479 | A1 | 4/2017 | Oomori et al. |
| 2019/0341359 | A1 * | 11/2019 | Tang ....................... H01L 24/95 |
| 2022/0052507 | A1 * | 2/2022 | Yang ................... H01S 5/06825 |
| 2022/0271843 | A1 * | 8/2022 | Mii ......................... G02B 6/428 |
| 2022/0413216 | A1 * | 12/2022 | Hosseini ................. G02B 6/43 |

FOREIGN PATENT DOCUMENTS

| | | | |
|---|---|---|---|
| JP | H06132413 A * | 5/1994 | |
| JP | 10-189864 A | 7/1998 | |
| JP | 2006-66705 A | 3/2006 | |
| JP | 2008-520111 A | 6/2008 | |
| JP | 2009-206384 A | 9/2009 | |
| JP | 2017-69490 A | 4/2017 | |
| WO | WO 2006/053277 A2 | 5/2006 | |

OTHER PUBLICATIONS

Combined Search and Examination Report issued Jan. 24, 2023 in GB 2211691.7 filed on Aug. 10, 2022, 7 pages.

* cited by examiner 64x phased array chip 65 tracks [64+1 GND]

103

30mm [*]

~70mm [*]

101

Thermistor
pad + 2 tracks [* *]
131

65 tracks [64+1 GND]

111

119

107

105

115

~45mm 160 tracks 160 tracks

~60-70mm

113

109

105

101

255

PCBA (multilayer)

251

253

Heatsink and TEC

½*L1

½*L1

R

X

Y

ELECTRONIC PACKAGE AND METHOD OF MANUFACTURING AN ELECTRONIC PACKAGE

CROSS REFERENCE

This application claims priority from UK application number 2211691.7, the contents of which are herein incorporated by reference.

FIELD

Embodiments described herein relate to an electronic package and a method of manufacturing an electronic package.

BACKGROUND

An electronic package comprises at least one active element with multiple connections to the at least one element. In more complex electronic packages, multiple levels of active elements and connections are provided.

BRIEF DESCRIPTION OF FIGURES

FIG. 2A shows the first sub-mount, FIG. 2B, the second sub-mount and FIG. 2C the combined first and second sub-mounts;

DETAILED DESCRIPTION

Figure 1:
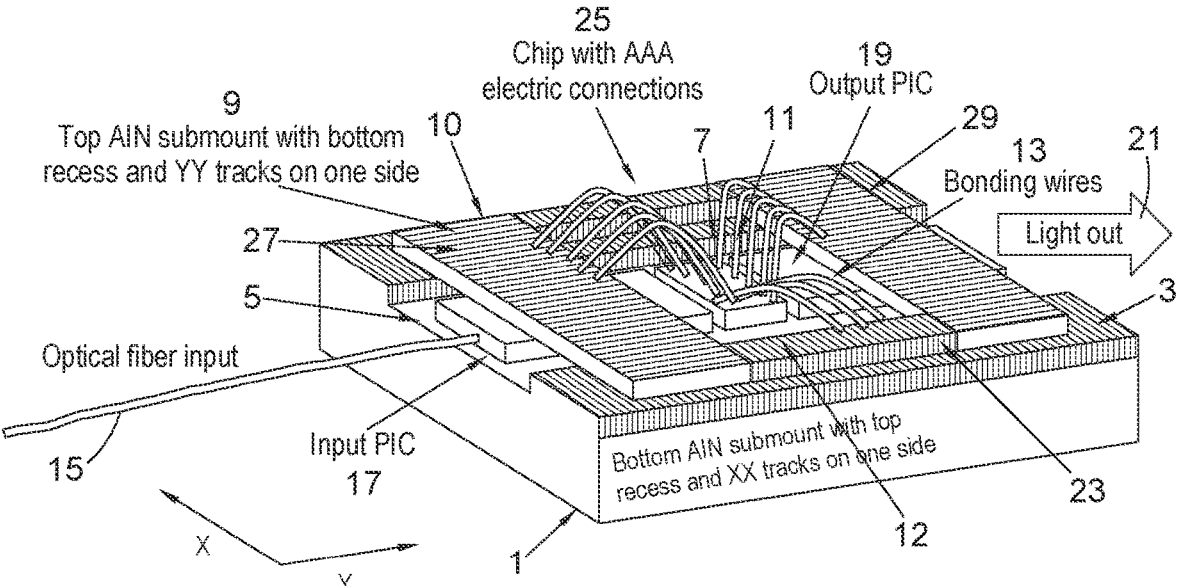
FIG. 1 is a schematic of a package in accordance with an embodiment.

In an embodiment, an electronic package is provided comprising: an active element; a first substrate; and a second substrate, the first substrate comprising a plurality of conductive tracks on a first surface, the second substrate comprising a plurality of conductive tracks on a second surface, the active element being provided on the first surface of the first substrate, the second substrate being provided overlying the first surface of the first substrate such that a face of the second substrate which is opposite to the second surface is in contact with the first surface, the second substrate having an opening to allow access to the active element and being positioned on the first substrate such that at least some of the plurality of conductive tracks on the first surface are exposed, the active element being electrically connected to at least some of the plurality of tracks on the first substrate and the plurality of tracks on the second substrate.

Many semiconductor and photonic devices require a large number of connections. However, there is a desire to keep the package containing the device small. The above arrangement provides a multilevel packaging platform for chips which can accommodate a high number of electrical connections, for example, over a hundred connections. Further, the arrangement allows good thermal conductivity between the levels, as the second substrate may be provided directly in contact with the first substrate. This reduces the chance of the package overheating which can result in failure of the package or at least sub-optimum performance of the active element.

The above allows an arrangement where a heat sink is provided on the bottom of the device and all connections are provided from the top.

In an embodiment, the first substrate and the second substrate comprise AlN. AlN has superior thermal properties and therefore allows heat dissipation within the package. AlN is a CMOS-compatible material, which has a wide bandgap of 6.2 eV, a broad transparency window covering from ultraviolet to mid-infrared, and a significant second-order nonlinear optical effect.

In an embodiment, the first and second substrates are provided in a tiered arrangement around the active element. Therefore, the active elements can be connected to tiers of conductive tracks provided around the active element. The tiers are steps which slope away from the active element. The tiers may be provided on all sides of the opening around the active element or just one or a subset of sides.

In an embodiment, the second substrate is directly in contact with the first substrate.

As noted above, the multilevel package can accommodate many electrical connections. In an embodiment, the first plurality of conductive tracks comprise at least 10 conductive tracks and wherein the second plurality of conductive tracks comprise at least 10 conductive tracks. However, many more tracks can be used. For example, the first plurality of conductive tracks may comprise at least 50 conductive tracks and the second plurality of conductive tracks may comprise at least 50 conductive tracks. In a further embodiment, the first plurality of conductive tracks may comprise at least 100 conductive tracks and the second plurality of conductive tracks may comprise at least 100 conductive tracks.

In a further embodiment, the package further comprises a heatsink and/or thermoelectric cooler "TEC".

In an embodiment, the active element is a photonic element. For example, the photonic element may be at least one selected from a laser, a phased array laser, a plurality of phased array lasers, a phase shifting array or a detector array. The arrangements described herein allow detectors which detect along their edge to be used. The phased laser arrays provided either as a single unit or multiple units allow interference effects and beam steering to be realised. Such elements require a large number of connections. Also, there is a need to couple light into and out of surfaces of the package which can reduce the area available for electrical connections.

To couple light either into or out from the package, the electronic package may further comprise a gap formed in the plane of the substrates to allow radiation emitted by the active element to exit the package. The gap may be formed along the plane between the first and second substrates.

The gap is formed as a recess in at least one of the first and second substrates. For example, the gap may be formed as a recess in the upper surface of the first substrate or a recess in the lower surface of the second substrate or the gap may be formed by the gap may be formed by both a recess in the upper surface of the first substrate and a recess in the lower surface of the second substrate. The gap may provide a path from the active element to the outside of the package or a path through the entire package.

In a further embodiment, the second substrate forms a bridge across said recess for radiation emission from said package. This arrangement allows light to be coupled into and out of the active element under the bridges. The bridges are not sitting directly on the in- and out-coupling chips allowing a small gap between them and therefore preventing from any potential damage to the in- and out-coupling chips during bonding process.

The conductive tracks formed on the bridge may be shaped (for example bent or curved) to direct allow connection to the conductive tracks away from the bridge.

Coupling light into and out of a photonic element can take away one side of the package where it is normally not possible to place bond wires.

The problem is even more serious when there are multiple electric and/or RF contacts as the bonding wires need to be short. Also in the case of multiple laser arrays the chip is wider on the side where light is extracted than the length of the chip which again reduces the area over which connections can be provided.

Thus, forming bridges with the substrates in addition to stacking the substrates provides a larger area for connecting to the package.

In a further embodiment, at least one photonic integrated circuit "PIC" is configured to direct light into or collect light emitted from the photonic element.

The above has discussed a package comprising first and second substrates. However, further substrates are possible. In an embodiment, an electronic package is provided, wherein the second substrate forms a plurality of further substrates arranged in a stack on the first surface of the first substrate such that the first substrate is the lowest substrate of the stack, each of the plurality of further substrates being provided with a plurality of conductors on a surface which is parallel to and furthest from the first surface of the first substrate, the plurality of further substrates being in a tiered arrangement to expose at least part of the conductive tracks on the lower substrates.

The further substrates may be configured to form an aperture to allow access to the active element. The further substrates may be arranged in a tiered formation around the active element Each of the further substrates may fully or partially surround the aperture. the tiers may fully or partially surround the aperture.

The active element may be electrically connected to at least some of the plurality of tracks on the first substrate and the plurality of tracks on the second substrate using bond wires, the bond wires having a length of at most 10 mm.

In the above arrangements, the further substrates form an aperture to allow access to the active element. The conductive tracks forming a stepped arrangements stepping away from the active element as the height of the stack increases.

The active element may be electrically connected to at least some of the plurality of tracks on the first substrate and the plurality of tracks on the second substrate using bond wires. In an embodiment, the bond wires having a length of at most 10 mm. The ability to use these shorter bond wires makes the package particularly suitable for RF uses. Shorter bonding wires reduces the requirement for impedance matching.

The electronic package may further comprise a PCBA provided on an opposing side of the first substrate to the first surface. A heatsink and thermoelectric coupler may be provided on an opposing side of the first substrate to the first surface. If the PCBA is present, the heatsink and thermoelectric coupler is provided on the opposing side of the PCBA to the active element. In an embodiment, the surface of the first substrate opposite to the first surface is free from contacts.

In a further embodiment, a method of fabricating an electronic package is provided, the method comprising:

providing a first substrate, said first substrate comprising a plurality of conductive tracks on a first surface;

providing an active element on the first surface of said first substrate;

providing a second substrate comprising a plurality of conductive tracks on a second surface;

positioning the second substrate overlying the first surface of the first substrate such that a face of the second substrate which is opposite to the second surface is in contact with the first surface, the second substrate having an opening to allow access to the active element and being positioned on the first substrate such that at least some of the plurality of conductive tracks on the first surface are exposed; and electrically connecting the active element to at least some of the plurality of tracks on the first substrate and the plurality of tracks on the second substrate.

In the above arrangement the active element is provided prior to the positioning of the second substrate.

FIG. 1 is a schematic of an electronic package in accordance with an embodiment. The electronic package comprises a first substrate 1. The first substrate is an AlN substrate. The substrate has a plurality of parallel conductive tracks 3 provided on a first surface of the first substrate. In the arrangement of FIG. 1, the first surface is provided on the uppermost side of first substrate 1. The tracks comprise a wire bondable conductive material such as Ti/Au, Cr/Au, Ni/PA/Au, Ni/Au (ENIPIG or ENIG). In the arrangement of FIG. 1, the first substrate has a central recess 5 which extends along a central strip of substrate 1. The plurality of conductive tracks 3 are provided on the non-recessed region of substrate 1.

In the recess, an active element 7 is provided. In this embodiment, the active element 7 is a photonic element such as a multiple laser array, a phased array laser, a plurality of phased array lasers, a detector or a phase shifter. Also, in the recess 5, a first photonic integrated circuit (PIC) 17 is provided and a second PIC 19 is provided. The first PIC 17, the active element 7 and the second PIC 19 are provided along the recessed strip. The first PIC 17 is connected to an input optical fibre 15 such that it receives its input from input optical fibre 15 and outputs to active element 7. The output of the active element is then directed to output PIC 19 which outputs light 21 from the package.

A second substrate 9 is then provided overlying the first substrate 1. The second substrate 9 is in direct contact with the first substrate 1 such that they are in thermal contact with one another. The second substrate 9 is also an AlN substrate which forms AlN sub-mount.

The second substrate 9 also has a plurality of conductive tracks 10 provided on its upper surface which will be referred to as its second surface. In FIG. 1, the second substrate 9 has a planar rectangular or square shape with a rectangular or square aperture 12 formed there-through. The second substrate is provided on the first substrate and positioned to allow access to the active element 7 though the aperture 12.

The aperture 12 is bounded by two sets of parallel edges. For ease, these will be referred to as front 23 and back 25 edges and left 27 and right 29 edges with reference to the frame of paper on which FIG. 1 is shown. However, these are relative terms and do not suggest a fixed or preferred orientation of the package. The front 23 and back edges are also separated along what will be referred to as the X direction and the left 27 and right edges 29 are separated along the Y direction which is orthogonal to the X direction.

The terms "upper" and "lower" are used as relative terms where the upper side of the package will be referred to as the side of the first substrate where the active element 7 is provided.

The recessed strip in the first substrate 1 extends along the Y direction. The second substrate is provided overlying the first substrate 1 such that the right and left edges 29, 27 (which extend in the X direction and are separated in the Y direction) are provided bridging the recess of the first substrate 1. The bridges formed by the second substrate can be used to allow light to be directed to and from the active element 7. In FIG. 1, further elements such as PICs 17, 19 are provided in the light path provided along the recess of the first substrate.

The front and back edges 23, 25 of the second substrate which are separated in the X direction are located on the conductive tracks of the first substrate, but positioned such that they allow the parts of the conductive tracks 3 of the first substrate 1 which are closest to the active element 7 to be exposed. In this embodiment, the front and back edges form a step-like structure with the first substrate 1.

On the second substrate, conductive tracks which extend along the Y direction are provided on the right and left edges of the second substrate. Conductive tracks which extend along the X direction are provided on the front and back edges 23, 25 of the second substrate 9.

The active element 7 is then wire bonded to the conductive tracks on the first and second substrate. This arrangement allows the active element to be wire bonded to the conductive tracks with short bond wires 11. The short bond wires may be 10 mm or less.

A fabrication method in accordance with an embodiment will now be described with reference to FIGS. 2A to 2C.

Figure 2A:
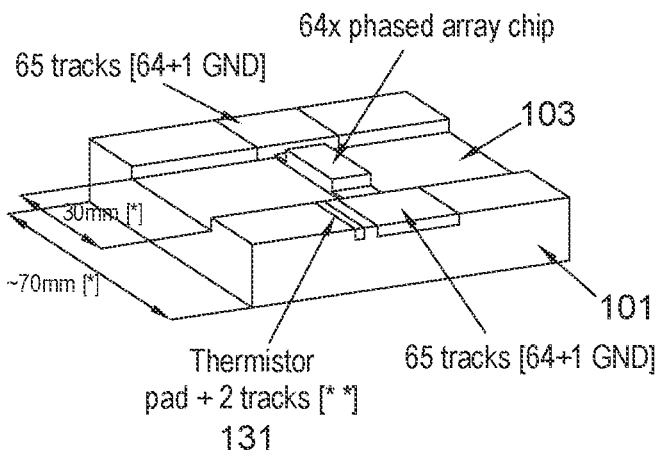
FIGS. 2A to 2C are schematics showing the fabrication of the package of FIG. 1, where

FIG. 2A shows a first substrate 101. The first substrate 101 is an AlN sub-mount which is approximately 70 mm wide in the X direction (the X and Y direction being the same as those defined for FIG. 1) The substrate 101 is mechanically milled to form a central strip recess 102. In this embodiment, the central strip recess is approx. 30 mm wide.

The parameters for the AlN substrates can be vary from application to application. In an example, the conductive tracks may have 0.1 mm track width, 0.1 mm spacing between tracks.

The recess, may, for example, have a depth of 0.7 mm. This depth also allows a gap between the PICs and bridges. The recess does not have to be formed in just one substrate. For example, 50% of it can be in the first substrate and another 50% can be on the second substrate (bottom side recess).

The AlN substrate or board is milled and the conductive tracks may be formed by sputtering or other suitable technique.

The active element and any other chips, for example, input and/or output PICs are then positioned in the recess of the first substrate. They may be fixed to the substrate using a non-conductive connection such as an epoxy or a conductive connection such as silver paint or dag.

The active element may be a multiple laser array with all the front facets along one of the chip edge. The phased array or any laser array chip is fabricated independently and is simply glued onto the recess (depending on the chip details conductive or nonconductive epoxy can be used—AlN is not electrically conductive).

The tracks are achieved in thick film deposition process or plating (electroplating or electro less)

A thermistor 131 is provided on the first substrate 101 close to the active element which allows the temperature close to the active element to be monitored.

Next, second substrate 105 is fabricated. The second substrate 105 is a generally planar substrate. The second substrate has a rectangular aperture 107 formed therein. The aperture is bounded by first 109 and second 111 edges which are separated in the X direction and third 113 and fourth 115 edges which are parallel and separated in the Y direction. Conductive tracks 119 are applied to the third and fourth edges. In this particular example, there are 160 tracks on each of the third edge 113 and the fourth edge 115. As an illustration of possible dimensions, in this example, the length of the substrate in the Y direction is approximately 60 to 70 mm. The width of the substrate in the X direction is approximately 45 mm.

The conductive tracks 119 are provided on the upper surface and, in some embodiments, on the side surfaces (i.e. the surfaces in the z direction) of the second substrate 105. The conductive tracks 119 are not provided on the lower surface of the second substrate which is parallel to and which faces in the opposing direction to the upper surface. This means that when the second substrate 105 is provided on top of the first substrate 101, there is no electrical contact between the second substrate 105 and the first substrate 101. However, the connection of the AlN substrates means that there is thermal contact between the two substrates. In this example, a strip shaped recess is also provided in the lower surface of the upper second substrate 105 extending in the Y direction so that the recess of the first substrate 101 and the second substrate 105 together form an aperture through the package in the Y direction.

Figure 2B:
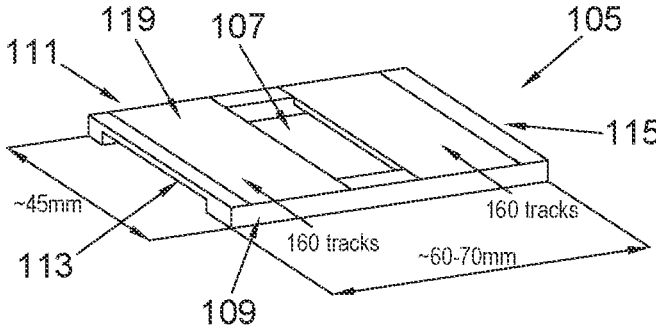
Figure 2C:
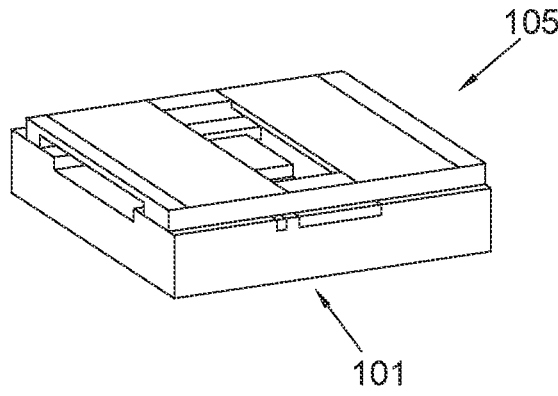

FIG. 2C shows the assembled structure with the second substrate 105 of FIG. 2B provided overlying the first substrate 101 of FIG. 2A. The second substrate 105 is oriented such that the third 113 and fourth 115 edges with the conductive tracks are each positioned to form a bridge transverse to the strip recess 103 that extends centrally on the first substrate 101. The recess in the lower surface of the second substrate 105 is provided to align with the central strip recess of the first substrate 101 to form an aperture to accommodate the active element and coupling of the light into and out of the active element. It should be noted that the shape of the recess can be adapted for the type of device. For example, if the active element does not require an input light signal and only outputs radiation, then the strip recess only needs to extend partially through the package and only provide one open side of the package.

The first 109 and second 111 edges which are perpendicular to the third 113 and fourth 115 edges are shaped and positioned such that they allow the conductive tracks on the first substrate 101 which are closest to the active element to be exposed. In this embodiment, a step-like structure is formed by the conductive tracks on the first substrate 101 and the first 109 and second 111 edges of the second substrate.

As shown in FIG. 1, wire bonding in then used to connect the chip with the package. In an embodiment, the bond pads are at least 100 $\mu m^2$ and have a layer of Au or Al on top to facilitate bonding.

Three substrates are shown above. However, any number of substrates may be used. As bonding of wires to the conductive tracks may be performed by a ball bonder, the maximum height of the ball bonder can limit the height of the stack of substrates. Typically, the height of the stack from the upper surface of the active element will be limited to about 1.5 mm.

Figure 3:
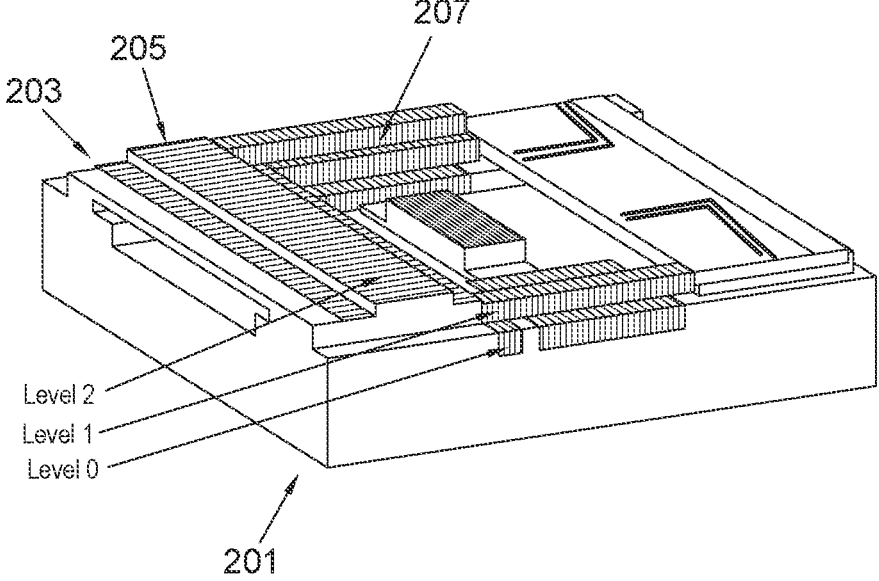
FIG. 3 is a schematic of a package in accordance with a further embodiment.

FIG. 3 is a further package in accordance with an embodiment. The device of FIG. 3 has three levels. Level 0, corresponds to the first sub-mount 201 which was described with reference to FIGS. 1 and 2. Level 1 is the second sub-mount 203 which is similar to the second substrate described with reference to FIGS. 1 and 2. Level 2 is a third sub-mount 205.

For clarity, in this example, only part of the second sub-mount 203 and third sub-mounts 205 are shown. The second sub-mount 203 differs slightly from the second sub-mount described with reference to FIGS. 1 and 2 in that the second sub-mount 205 also has conductive tracks provided on the first and second edges (for simplicity, the orientation described with reference to FIGS. 1 and 2 will be used. As for FIGS. 1 and 2, this is used to aid explanation of relative features and does not indicate a required orientation of the package.

Figure 4:
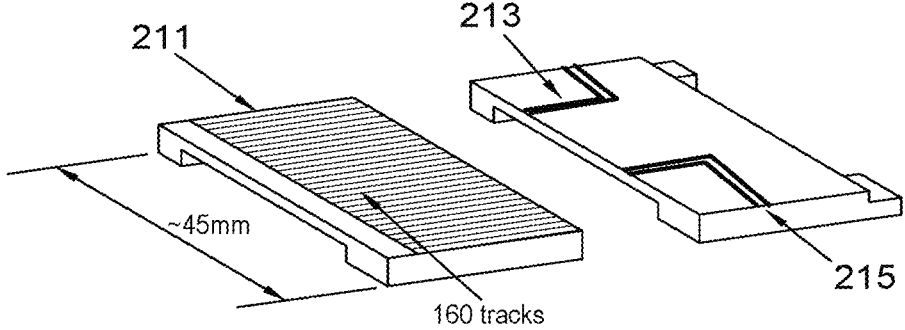
FIG. 4 is a schematic of a variation on a second substrate.

Also, the fourth edge of the second substrate/sub-mount 203 differs from that of FIGS. 1 and 2B. FIG. 4 shows the third 211 and fourth 213 edges of the second sub-mount 203. The fourth edge (right hand edge as shown in FIG. 4) has two sets of bent tracks 215 which are bent towards the first and second edges to allow electrical connection from the right hand edge of the photonic chip to be made to the first and second edges. This allows the fourth edge to be kept free of bond wires if the fourth edge is to be used for the light to be directed out of the package along the fourth edge.

The third sub-mount 205 is similar to the second sub-mount 203 however, the aperture of the third sub-mount 205 is wider than that of the second sub-mount 203. This means that when the third sub-mount 205 is provided on the second sub-mount 203, the conductive tracks on the third sub-mount 205 are stepped back further from the active element than those of the second sub-mount exposing conductive tracks in the second sub-mount 203 below the third sub-mount Thus, in the device of FIG. 3, a stepped structure 207 of conductive tracks is shown from the first sub-mount, the second sub-mount and the third sub-mount which allows provides three layers of densely packed conductive tracks to which the active element can easily connect using short bond-wires.

Figure 5:
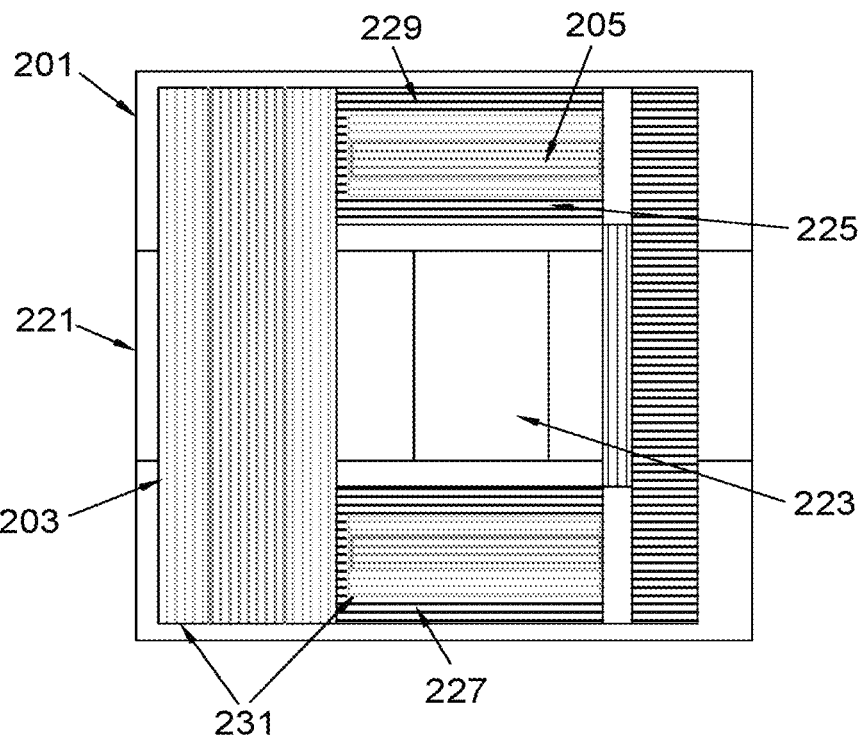
FIG. 5 is a plan view of the package of FIG. 3.

FIG. 5 is a plan view of the device of FIG. 3. The first substrate 201 has a central recessed area 221. As described above, the recessed area 221 may be formed using either or both of the first substrate 201 and second substrate 203. The active element 223 is provided in the recessed area 221. It should be noted that in this example, for clarity, the input and output PICs are not shown. However, these are not always necessary.

Conductive tracks 225 and then provided on the first 227 and second 229 edges. The conductive tracks as shown as a hashed region. (It should be noted that the direction of the hashing does not indicate the direction of the conductive tracks).

The second substrate 203 is then shown with conductive tracks 231 formed on each edge of the second substrate 203. The second substrate 203 is formed with an aperture which shows that the active element 223 is visible through the aperture. As explained above, this is done in order to allow bonding or other connection to the active element 223.

Finally, the third substrate 205 is provided overlying the second substrate 203. The third substrate 205 forms a larger aperture around the active element 223 and, in this example, is just shown as covering three sides of the package. Even if the third substrate 205 just covers three sides, it still provides additional conductive tracks due to the extra tier of conductive tracks. Any additional tier provides further conductive tracks regardless of whether it partially or wholly surrounds the aperture. The third substrate 205 is set back from the aperture with respect to the second substrate 203. This allows the formation of a stepped or tiered wiring array of conductive tracks to which the active element can connect.

For example, if the active element is a phased array laser chip, this may have, for example 64 or so connections. If a plurality of these laser chips are provided, for example to allow beam steering etc, this may require many hundreds of connections. The structure described with reference to FIGS. 1 to 5 provides a structure which can accommodate this connection requirement through the use of tiered AlN substrates.

Figure 6:
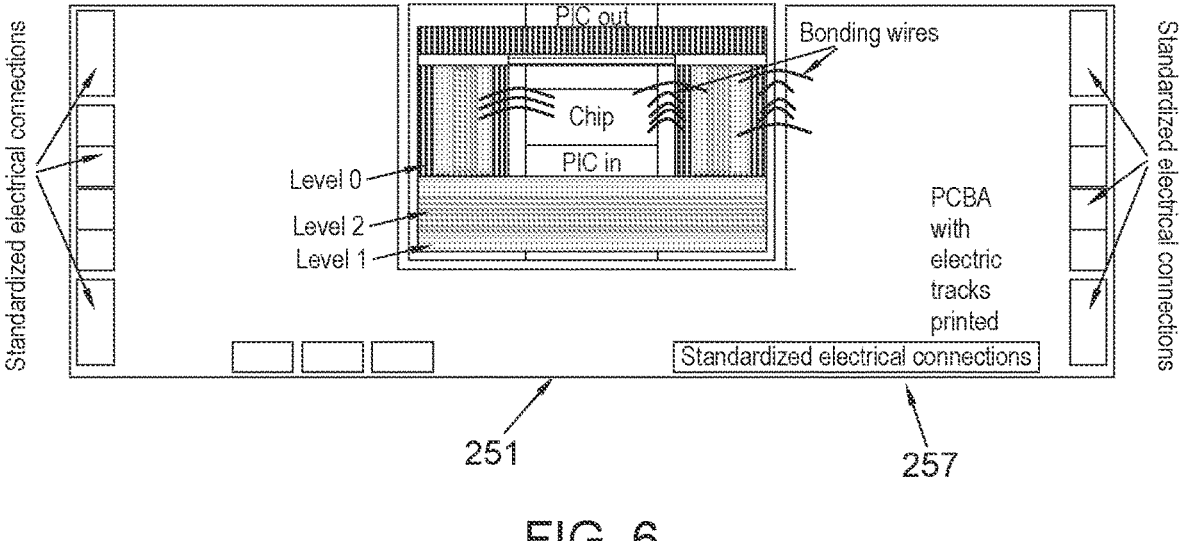
FIG. 6 is a plan view of the package of FIG. 5 provided on a PCBA board.

FIG. 6 shows a plan view of the chip which has been described with reference to FIG. 5 provided in a further external package which is PCBA board 251. The structure of FIG. 6 provided on a heatsink and thermo-electric coupler 253.

Figures 8, 9:
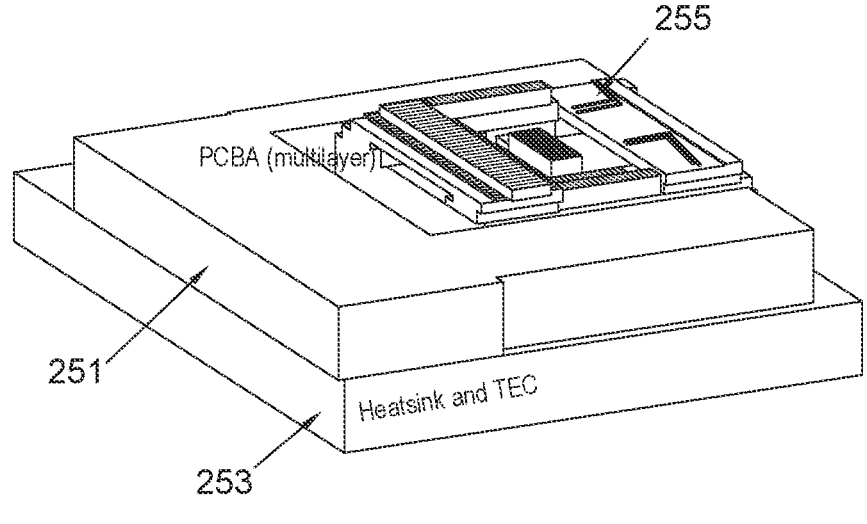
FIG. 8 is a perspective view of the package of FIG. 5 provided on a PCBA board and heatsink.
FIG. 9 is a perspective view of the package of FIG. 2C showing dimensions.

First, referring to FIG. 8, heatsink and thermoelectric coupler 253 are provided as the lower layer of the entire package. On top of this, a multilayer PCBA 251 is provided and onto this, the package 255 that has been described with reference to FIGS. 1 to 5 is positioned. This package 255 which has been previously described will be referred to as central package 255.

As shown in FIG. 6, the PCBA 251 is provided with electrical connections around its edge. However, the electrical connections 257 could be provided elsewhere om the PCBA 251. The central package 255 is then connected via wire bonding or other bonding to these connections. In some embodiments, the connections on PCBA 253 may also be provided in a tiered structure to allow connection from the PCBA 251 from the central package 255.

The PCBA 251 is much larger than the central package 255. Therefore, there is more space to allow electrical connections to be provided to be fanned out or otherwise spread out. Therefore, the PCBA 251 does not suffer from the difficulty of connecting the active element to the substrates within the central package 255 where many connections are required to a central chip in a particularly small area.

As shown in FIG. 6, the central package 255 is provided on an edge of the PCBA 251 to allow light to be coupled out of the package 255.

Figure 7:
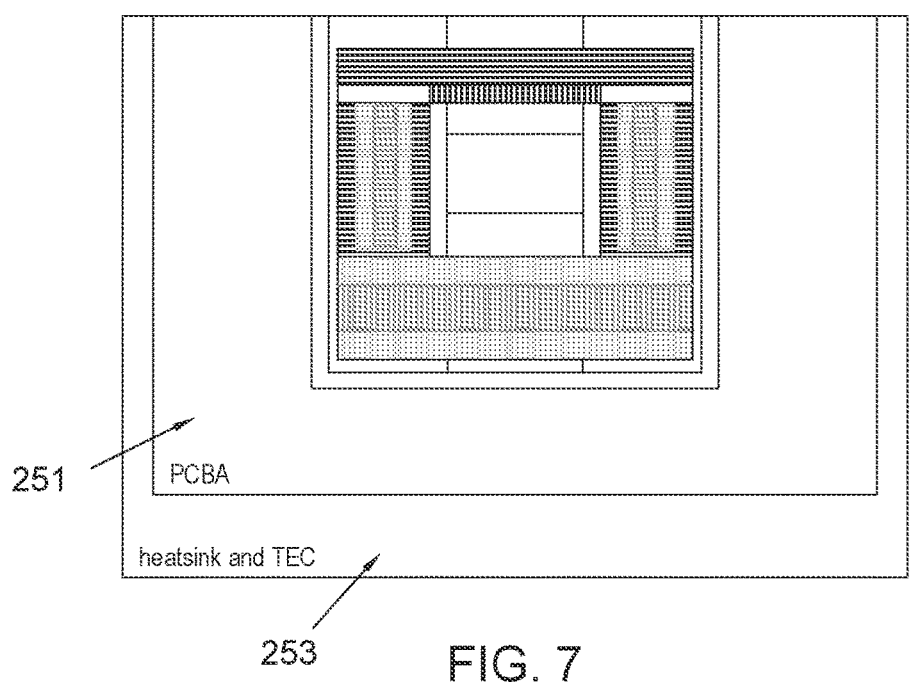
FIG. 7 is a plan view of the package of FIG. 5 provided on a PCBA board and heatsink.

This is shown more clearly in FIG. 7 which also shows a plan view of the arrangement of the PCBA 251 and the heatsink and thermoelectric coupler (TEC) 253.

The perspective view of the structure shown in FIG. 8 allows the view of the tiered substrates 201, 203, 205 within the central package 255 to be shown. The tiered substrates step down towards the central active element. However, they are also tiered such that they step down towards the outside of the package. This allows connection to be made to the conductive tracks to connect the conductive tracks with the PCBA.

Many different dimensions are possible for the package. In an example, the package may be designed as set out below, $$Y_{min} = A_0 * (w+s) + L_1$$

$A_0$—number of electrical tracks on one side of the package on level 0 w=width of the electric track s=spacing between electric tracks

In practice w=0.1 mm, 5=0.1 mm $L_1$—total length of the AlN board level 1 in the Y direction $$X_{min}=A_1{}^*(w+s)$$

$A_1$—number of electrical tracks on one side of the package on level 1

$L_2$-length of the AlN board level 2

$R_{min}$—width of the chip+8 mm for chip manipulation

FIG. 9 is a schematic of the package showing the above dimensions.

In an embodiment, the following order is used to construct the package:

First substrate→active element (photonic element)→bond devices close to the edge to power them up and align PIC chips→continue with the further substrates and further bonding.

Whilst certain embodiments have been described, these embodiments have been presented by way of example only, and are not intended to limit the scope of the inventions. Indeed, the novel devices, and methods described herein may be embodied in a variety of other forms; furthermore, various omissions, substitutions and changes in the form of the devices, methods and products described herein may be made without departing from the spirit of the inventions. The accompanying claims and their equivalents are intended to cover such forms or modifications as would fall within the scope and spirit of the inventions.

The invention claimed is:

1. An electronic package comprising: a photonic element; a first substrate; and a second substrate, the first substrate comprising a plurality of conductive tracks on a first surface, the second substrate comprising a plurality of conductive tracks on a second surface, the photonic element being provided on the first surface of the first substrate, the plurality of conductive tracks on the first surface and the plurality of conductive tracks on the second surface being on the same side of the electronic package, the second substrate being provided overlying the first surface of the first substrate such that a face of the second substrate which is opposite to the second surface is in contact with the first surface, the second substrate having an opening therethrough from the second surface to allow access to the photonic element, the first and second substrates provided in a tiered arrangement such that at least some of the plurality of conductive tracks on the first surface are exposed by the opening through the second substrate, the photonic element being electrically connected to at least some of the plurality of tracks on the first substrate and the plurality of tracks on the second substrate, wherein the electronic package further comprises a gap formed along the plane where the first and second tiered substrates are in contact, the gap being formed by a recess provided in at least one of the first and second substrates, the second substrate forming a bridge across the gap formed by said recess, the gap formed by the recess extending through the electronic package to allow radiation to be directed to or from the photonic element along the plane between the first and second tiered substrates, the second substrate being positioned such that radiation can pass to or from the photonic element under the bridge across the recess, wherein conductive tracks of the second substrate are provided on the bridge.

2. The electronic package of claim 1, wherein the first substrate and the second substrate comprise AlN.

3. The electronic package of claim 1, wherein the first plurality of conductive tracks comprise at least 10 conductive tracks and wherein the second plurality of conductive tracks comprise at least 10 conductive tracks.

4. The electronic package of claim 1, wherein the second substrate is directly in contact with the first substrate.

5. The electronic package of claim 1, wherein the photonic element is a at least one selected from a laser, a phased array laser, a plurality of phased array lasers, a phase shifting array or a detector array.

6. The electronic package of claim 1, wherein the conductive tracks of the second substrate provided on the bridge are curved or bent to allow direct connection to these tracks to be made away from the bridge.

7. The electronic package of claim 1, further comprising at least one photonic integrated circuit "PIC" configured to direct light into or collect light emitted from the photonic element.

8. The electronic package of claim 1, wherein the second substrate forms a plurality of further substrates arranged in a stack on the first surface of the first substrate such that the first substrate is the lowest substrate of the stack, each of the plurality of further substrates being provided with a plurality of conductors on a surface which is parallel to and furthest from the first surface of the first substrate, the plurality of further substrates being in a tiered arrangement to expose at least part of the conductive tracks on the lower substrates.

9. The electronic package of claim 8, wherein the further substrates form an aperture to allow access to the photonic element.

10. The electronic package of claim 1, wherein the photonic element is electrically connected to at least some of the plurality of tracks on the first substrate and the plurality of tracks on the second substrate using bond wires, the bond wires having a length of at most 10 mm.

11. The electronic package of claim 1, further comprising a PCBA provided on an opposing side of the first substrate to the first surface.

12. The electronic package of claim 1, further comprising a heatsink and thermoelectric coupler provided on an opposing side of the first substrate to the first surface.

13. The electronic package of claim 1, wherein the surface of the first substrate opposite to the first surface is free from contacts.

14. A method of fabricating an electronic package, the method comprising:

providing a first substrate, said first substrate comprising a plurality of conductive tracks on a first surface;

providing an photonic element on the first surface of said first substrate;

providing a second substrate comprising a plurality of conductive tracks on a second surface, the plurality of conductive tracks on the first surface and the plurality of conductive tracks on the second surface being on the same side of the electronic package;

positioning the second substrate overlying the first surface of the first substrate such that a face of the second substrate which is opposite to the second surface is in contact with the first surface, the second substrate having an opening therethrough from the second surface to allow access to the photonic element, the first and second substrates provided in a tiered arrangement, the second substrate being positioned on the first substrate such that at least some of the plurality of conductive tracks on the first surface are exposed; and electrically connecting the photonic element to at least 5 some of the plurality of tracks on the first substrate and the plurality of tracks on the second substrate, the method further comprising forming a gap along the plane where the first and second tiered substrates are in contact, the gap being formed by providing a recess in 10 at least one of the first and second substrates, the second substrate forming a bridge across the gap formed by said recess, the gap formed by the recess extending through the electronic package to allow radiation to be directed to or from the photonic element 15 along the plane between the first and second tiered substrates, the second substrate being positioned such that radiation can pass to or from the photonic element under the bridge across the recess, wherein conductive tracks of 20 the second substrate are provided on the bridge.

\* \* \* \* \*